(12) United States Patent
Steiner

(10) Patent No.: US 6,673,471 B2
(45) Date of Patent: Jan. 6, 2004

(54) CORROSION PREVENTION FOR CAC COMPONENT

(75) Inventor: R. Richard Steiner, University Heights, OH (US)

(73) Assignee: Nikko Materials USA, Inc., Chandler, AZ (US)

( * ) Notice: Subject to any disclaimer, the term of this patent is extended or adjusted under 35 U.S.C. 154(b) by 0 days.

(21) Appl. No.: 09/792,717

(22) Filed: Feb. 23, 2001

(65) Prior Publication Data

US 2002/0119342 A1 Aug. 29, 2002

(51) Int. Cl.⁷ ............... B32B 3/00; B32B 15/01; B32B 15/04; B32B 15/20
(52) U.S. Cl. ............ 428/652; 428/192; 428/607; 428/447; 428/448; 428/450; 428/674; 428/626
(58) Field of Search ............... 428/209, 192, 428/194, 195, 198, 457, 901, 607, 618, 652, 675, 447, 446, 448, 450, 332, 336, 651, 674, 626; 439/55; 29/17.5; 361/750, 762

(56) References Cited

U.S. PATENT DOCUMENTS

| | | | |
|---|---|---|---|
| 4,357,395 A | 11/1982 | Lifshin et al. | 428/607 |
| 4,383,003 A | 5/1983 | Lifshin et al. | 428/611 |
| 4,455,181 A | 6/1984 | Lifshin et al. | 156/150 |
| 4,722,765 A | 2/1988 | Ambros et al. | 156/630 |
| 4,781,969 A | 11/1988 | Kobayashi et al. | 428/209 |
| 4,875,283 A | * 10/1989 | Johnston | 29/830 |
| 4,912,020 A | 3/1990 | King et al. | 430/311 |
| 5,153,050 A | 10/1992 | Johnston | 428/209 |
| 5,256,474 A | * 10/1993 | Johnston | 428/220 |
| 5,482,586 A | 1/1996 | Fujikake et al. | 156/233 |
| 5,674,596 A | 10/1997 | Johnston | 428/209 |
| 5,725,937 A | 3/1998 | Johnston | 428/209 |
| 5,779,870 A | 7/1998 | Seip | 205/77 |
| 5,942,315 A | 8/1999 | Johnston | 428/209 |
| 5,951,803 A | 9/1999 | Johnston | 156/233 |
| 6,019,910 A | 2/2000 | Achari et al. | 252/79.5 |
| 6,048,430 A | 4/2000 | Johnston | 156/233 |
| 6,299,721 B1 | * 10/2001 | Poutasse et al. | 156/278 |

FOREIGN PATENT DOCUMENTS

JP 08-023165 * 1/1996

OTHER PUBLICATIONS

U.S. Continuation–in–Part patent application Ser. No. 09/714,811, entitled: Protective Coatings for Improved Tarnish Resistance in Metal Foils, filed Nov. 15, 2000, Clouser et al., 43 pages specification, 7 pages claims, 1 page Abstract, 4 sheets of drawings (55 total pages).

* cited by examiner

*Primary Examiner*—Michael LaVilla
(74) *Attorney, Agent, or Firm*—Mark Kusner; Michael A. Jaffe

(57) ABSTRACT

A component for use in manufacturing articles such as printed circuit boards, the component comprising:
  a sheet of copper foil which, in a finished printed circuit board, constitutes a functional element;
    a substrate sheet of aluminum which constitutes a discardable element, and
  a protective coating layer on a surface of said substrate, one surface of the copper sheet and the coating layer on said substrate aluminum sheet being essentially uncontaminated and engageable with each other at an interface, and the uncontaminated surfaces of the sheets being manufactured together to define a substantially uncontaminated central zone inwardly of the edges of the sheets and unjoined at the interface.

21 Claims, 2 Drawing Sheets

CORROSION PREVENTION FOR CAC COMPONENT

FIELD OF THE INVENTION

The present invention relates to printed circuit boards in general, and more specifically to components employed in the manufacturing of printed circuit boards and other articles.

BACKGROUND OF THE INVENTION

U.S. Pat. Nos. 5,153,050, 5,674,596 and 5,942,315, all to Johnston, disclose components for use in manufacturing articles such as printed circuit boards. The components are constructed of at least one sheet of copper foil that, when fabricated into a printed circuit board, constitutes a functional element of the board, i.e., the conductive paths. The other element of the component is a substrate sheet of aluminum that constitutes a discardable element of a finished printed circuit board. One surface of each of the copper sheet and the aluminum sheet is essentially uncontaminated and is engageable with the other surface at an interface.

A band of flexible adhesive joins the uncontaminated surfaces of the sheets together at their borders and defines a substantially uncontaminated central zone interiorally of the edges of the sheets and unjoined at the interface. The aluminum substrate provides stiffening for the copper foil and makes handling much easier.

The component may be constructed of two sheets of copper foil that in a finished printed circuit board both constitute functional elements of separate boards and a single sheet of aluminum that constitutes a discardable element. The inner surface of each of the copper sheets and both surfaces of the aluminum sheets are essentially uncontaminated and engageable with each other at interfaces on opposite sides of the aluminum.

While components of the type heretofore described have found advantageous application in the manufacture of printed circuit boards, in some laminating processes, a reaction between the aluminum and copper occurs resulting in a staining and discoloration of the copper. It is postulated that the cause of the staining of the copper may be the result of galvanic corrosion or may be the result of an oxidation of the aluminum and a subsequent reaction with the copper. In any event, to some laminators, this staining of the copper renders the resultant laminate(s) unusable.

The present invention provides a CAC type component having an aluminum substrate sheet and a coating thereon to prevent staining and discoloration of the copper foil during a lamination process.

SUMMARY OF THE INVENTION

In accordance with the present invention, there is provided a component for use in manufacturing articles such as printed circuit boards. The component is comprised of a sheet of copper foil which, in a finished printed circuit board, constitutes a functional element and a substrate sheet of aluminum which constitutes a discardable element. The aluminum has a coating layer on a surface thereof. One surface of the copper sheet and the coating layer on the substrate aluminum sheet are essentially uncontaminated and engageable with each other at an interface. A flexible adhesive joins the uncontaminated surfaces of the sheets together at their borders and defines a substantially uncontaminated central zone inwardly of the edges of the sheets and unjoined at the interface.

It is an object of the present invention to provide a copper/aluminum/copper component that is less susceptible to copper staining and/or corrosion.

It is another object of the present invention to provide a copper/aluminum/copper component as described above having a coated aluminum support substrate to prevent the aforementioned staining and/or corrosion problem.

It is a further object of the present invention to provide a copper/aluminum/copper component as described above, wherein the coating on the aluminum preferably does not transfer, contaminate or remain on the copper when the aluminum support substrate is separated therefrom.

These and other objects will become apparent from the following description of a preferred embodiment taken together with the accompanying drawings and the appended claims.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein.

DETAILED DESCRIPTION OF PREFERRED EMBODIMENT

Figure 1:
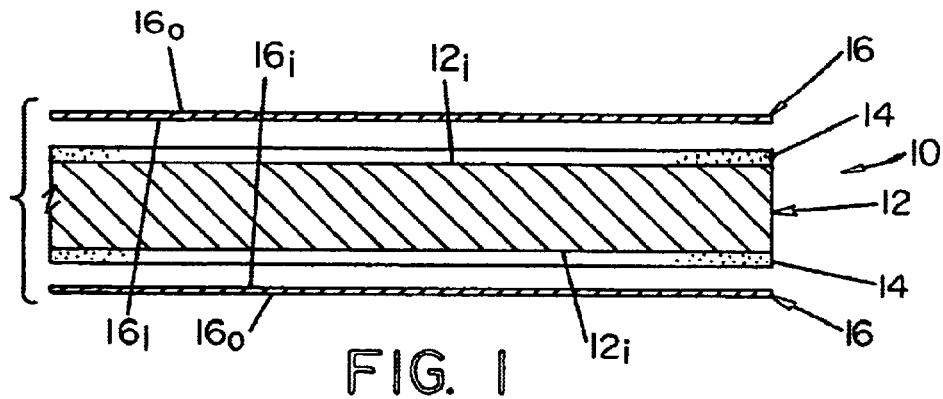
FIG. 1 is a schematic sectional view on enlarged scale of one embodiment of the component for use in the manufacturing of printed circuit boards embodying the features of the present invention.

Referring now to the drawings wherein the showings are for the purpose of illustrating the preferred embodiment of the invention only, and not for the purpose of limiting same, a component 10 (also known as CAC, which is an acronym for copper/aluminum/copper) is shown in cross-section in FIG. 1. Component 10 is comprised of a metal substrate 12 having surfaces $12_i$ that have a protective layer 14 applied thereto. Surfaces $12_i$ are substantially uncontaminated. Metal substrate 12 is preferably formed of a commercial grade aluminum having a thickness between about 0.010 and about 0.020 inches. Metal substrate 12 may be made from aluminum having a thickness between about 0.001 inches and about 0.125 inches depending upon the end use.

In accordance with the present invention, uncontaminated surfaces $12_i$ of aluminum substrate 12 are preferably coated with a protective layer 14 to prevent interaction between copper foil 16 and surfaces $12_i$ of aluminum substrate 12, before and during a lamination process. Aluminum surface $12_i$ may be coated with a metal protective layer 14 such as chromium, copper, nickel, silver, gold or alloys thereof A metal protective layer 14 may be applied by any number of different deposition processes, such as by way of example and not limitation, a thermal deposition process, such as arc spraying, a combustion chemical vapor deposition process, an electrodeposition process, an electroless process or a vacuum deposition process such as sputtering or chemical vapor deposition. A metal protective layer 14 preferably has the minimum thickness necessary to prevent the above-identified staining problem. A minimum thickness that would not allow staining is believed to be about 20 Å. Accordingly, a metal protective layer 14 has a thickness of at least about 20 Å.

In accordance with one aspect of the present invention, protective layer 14 is formed of an inorganic material, such as an inert silane, as disclosed in U.S. Pat. Nos. 5,622,782 and 5,614,324, the disclosures of which are incorporated herein by reference. The inert silane material may be applied by a dipping, spraying, plasma deposition or a blade wiping process. Inert silane compounds are disclosed in the above-identified U.S. patents. A preferred inert silane compound for forming protective layer 14 is propyltrimethoxysilane (PTMO). Protective layer 14 of propyltrimethoxysilane (PTMO) having a thickness of about 2.5 $\mu g/dm^2$ (microgram per square decimeter) provided satisfactory results.

A copper foil 16 is attached to the coated aluminum substrate 12. The copper foils used with this invention can be made using one of two techniques. Wrought or rolled copper foil is produced by mechanically reducing the thickness of a copper or copper alloy strip or ingot by a process such as rolling. Electrodeposited foil is produced by electrolytically depositing copper atoms on a rotating cathode drum and then peeling the deposited foil from the cathode. Electrodeposited copper foils find advantageous application with this invention.

The copper foils typically have nominal thicknesses ranging from about 0.0002 inch to about 0.02 inch. Copper foil thickness is sometimes expressed in terms of weight and typically the foils of the present invention have weights or thicknesses ranging from about ⅛ to about 14 ounces per square foot ($oz/ft^2$). Especially useful in forming printed circuit boards are copper foils having weights of ⅓, ½, 1 or 2 $oz/ft^2$.

Copper foils produced by an electrodeposition process have a smooth or shiny (drum) side and a rough or matte (copper deposit growth front) side, and are conventionally referred to as "base foil." It is known to treat base copper foil to produce micronodules on the matte side thereof. Such treated foil is referred to as "treated copper foil." The term "reverse treated copper foil" is conventionally used to refer to a copper foil that is treated to produce micronodules of copper on the shiny side thereof. "Double treated copper foil" is copper foil that is treated to produce micronodules on both sides of the foil. All of the foregoing types of foil may find advantageous application with this invention.

In a preferred embodiment of the present invention, copper foil 16 is a ½ oz. base copper foil, which means that there is ½ oz. of copper by weight per square foot of the foil. This equates to a thickness of approximately 0.0007 inches. Generally speaking, ½ oz. copper foil is the industry standard at the present time for PC boards. As indicated above, other types and weights of copper foil 16 may be used and still fall within the scope of the present invention.

Copper foil 16 has an outer surface $16_o$, that is roughened to make it more readily adherable to the prepreg to which it will be bonded in the PC board making process. Inner surface $16_i$ of copper foil 16 is clean and uncontaminated and is often referred to as "virgin." In a finished printed circuit board, inner surface $16_i$ constitutes a functional element and will be etched to produce the desired circuit conductor configuration. Protective layer 14 and surface $12_i$ of aluminum substrate 12 which engage surface $16_i$ are also essentially uncontaminated.

Figure 2:
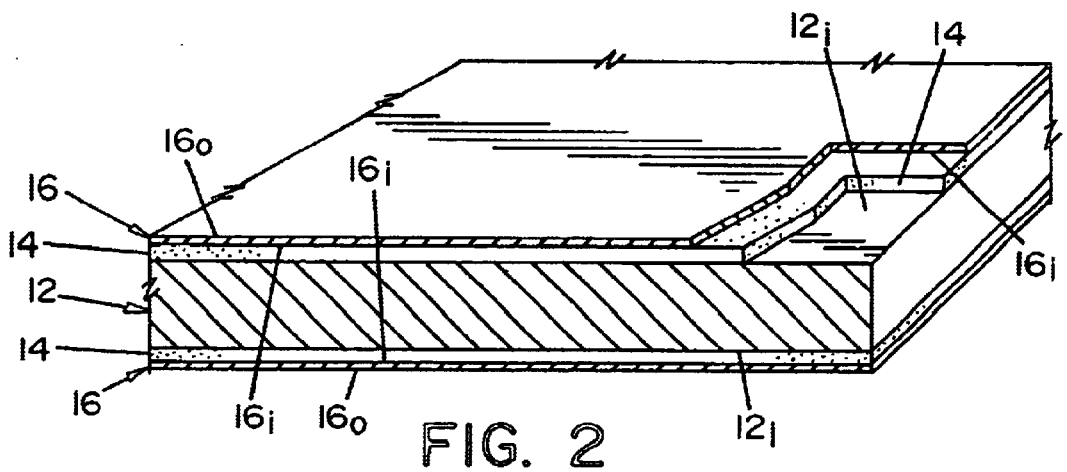
FIG. 2 is another embodiment thereof.

On the bottom surface of aluminum substrate 12 is a protective layer 14 and a second sheet of copper foil 16, also having an outer oxidized surface $16_o$ and a "virgin" or uncontaminated inner surface $16_i$, not seen in FIG. 2. The lower mating surface of aluminum substrate 12, with protective layer 14 thereon, is also as clean and uncontaminated as it is possible to make.

Figure 3:
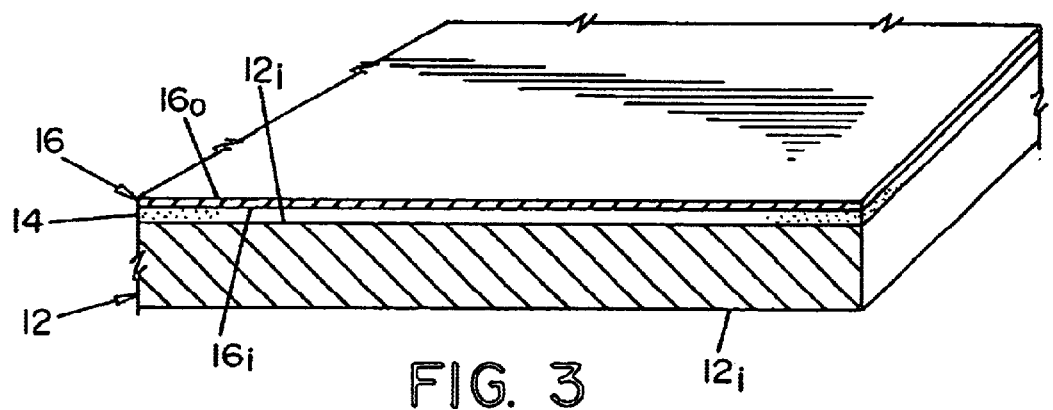
FIG. 3 is a schematic plan view of the component made in accordance with either of the embodiments.

FIG. 3 illustrates another embodiment of the present invention. FIG. 3 shows a sheet of copper foil 16 on only one side of aluminum substrate 12. This embodiment of the invention would be employed depending on the board manufacturer's design and requirements for a completed board. Aside from it having only a single layer of copper foil 16, it is the same as the FIG. 1 embodiment. Copper foil 16 will constitute a functional element of a finished printed circuit board and aluminum substrate 12 will constitute a discardable element.

Figure 4:
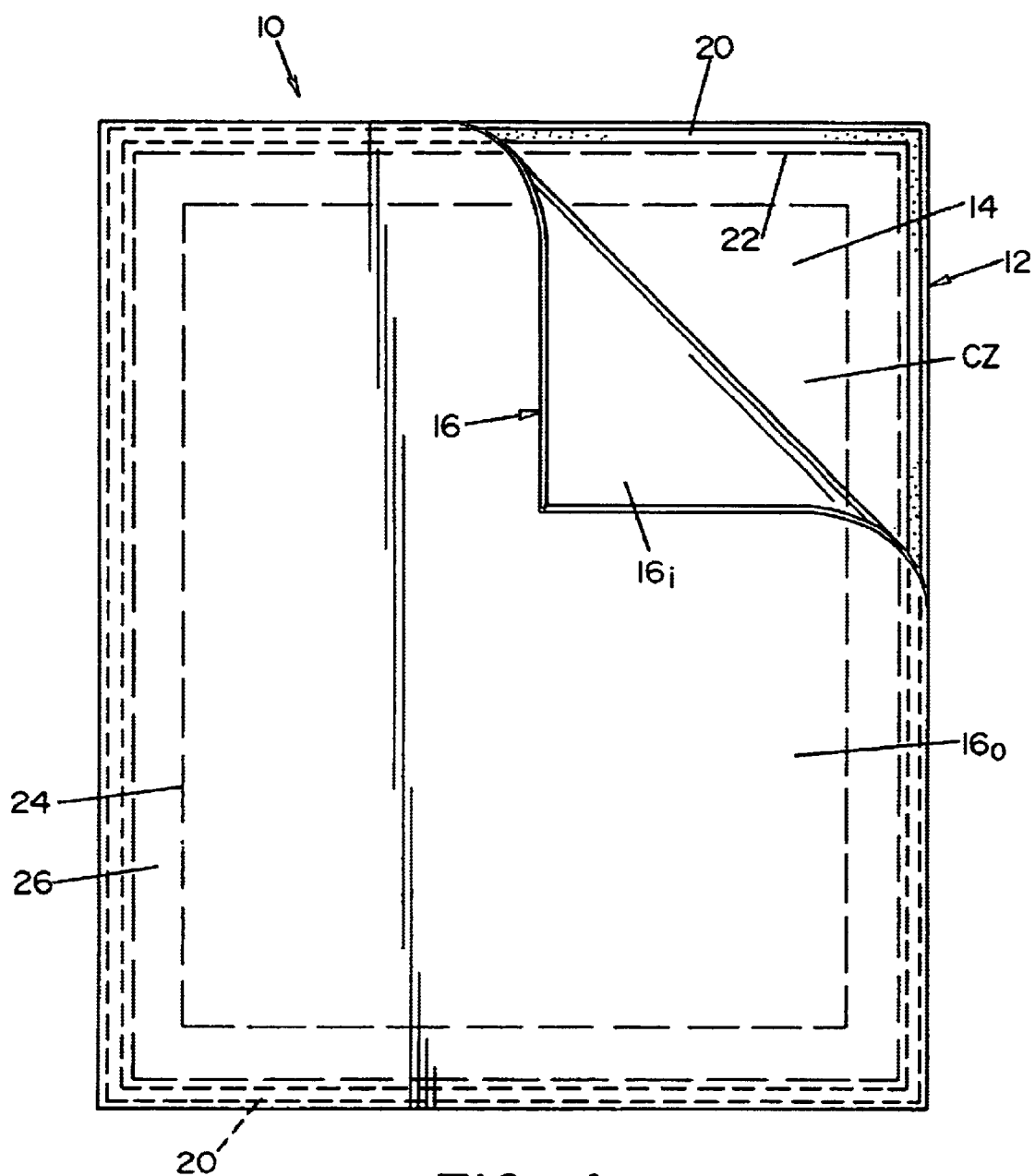
FIG. 4 is a plan view of the component made in accordance with either of the embodiments.

Referring next to FIG. 4, laminated component 10 or CAC is viewed with surface $16_o$ of copper foil 16 facing upwardly and peeled back at one corner.

Component 10, shown in FIG. 4, includes an aluminum substrate 12 of commercial grade aluminum which is illustrated as from about 0.010 to about 0.015 inches in thickness. Overlaying aluminum substrate 12, is protective layer 14. On protective layer 14 is a sheet of copper foil 16 which, in the illustrative example, would be ½ oz. copper, i.e., approximately 0.0007 inches in thickness. The peeled corner exposes inner or "virgin" surface of both copper foil 16 and metal substrate 12 with protective layer 14 thereon.

In the embodiment shown, a band of flexible adhesive 20 extends around the periphery of component 10 at or near the border of aluminum substrate 12 to join uncontaminated surfaces, $16_i$ and $12_i$ of the copper and the aluminum together at their borders. It will, of course, be appreciated by those skilled in the art that the periphery of aluminum substrate 12 and copper foil(s) 16 may be joined by means other than adhesive, and still find advantageous application according to the present invention. Since the contacting surfaces are "virgin," or at least as clean as is physically possible to make them, adhesive 20 creates a substantially uncontaminated central zone CZ interior to the edges of the sheets. The central zone is unjoined at the interface.

The band of flexible adhesive 20 is located in an adhesive application zone defined by the dotted lines 22 and the edge of the component CAC. The zone may be from about 0.10 to 1.0 inches wide depending upon both the end product requirements and the size of the sheets of aluminum and copper being used. An adhesive band or strip from approximately 0.060 to approximately 0.090 inches in width has been found satisfactory although it may be from about 0.010 inches to 0.500 depending upon the size of the sheets being laminated and from approximately 0.0005 to approximately 0.005 inches thick. A thickness of 0.0005 to 0.002 has been found satisfactory. In the drawings, the central zone CZ is defined by a borderline 24 spaced inwardly from the adhesive application zone line 22.

Thus, band 26 of flexible adhesive 20 seals the layers of copper and aluminum before and during the manufacturing process against the intrusion of prepreg dust or any other contaminant which could result from particles in the air, fingerprints, grease spots, or the like.

Whereas the configuration of the CAC component has been described with reference to a single sheet of copper foil 16 lying on one side of aluminum substrate 12, the invention is equally applicable to the embodiments shown in both FIGS. 1 and 2. That is, copper foil 16 may be secured to both opposite sides of aluminum substrate 12. In the finished product, both copper foils 16 will constitute functional elements of separate PC boards and the single aluminum substrate constitute a discardable element.

In the FIG. 1 configuration, one surface each of copper foils 16 and both surfaces of aluminum substrate 12 are essentially "virgin" and uncontaminated. The uncontaminated surfaces $16_i$ of copper foil 16 oppose uncontaminated surfaces 12$_i$, of aluminum substrate 12 and thus define two substantially uncontaminated central zones inwardly of the edges of the sheets on opposite sides of aluminum substrate 12. By coating aluminum substrate 12 with a barrier or protective layer 14, any type of copper foil 16 may be adhered thereto without concern for aluminum substrate 12 staining copper foil 16 before or during a lamination process.

The foregoing description is a specific embodiment of the present invention. It should be appreciated that this embodiment is described for purposes of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

Having described the invention, the following is claimed:

1. A component for use in manufacturing printed circuit boards, the component comprising:
    a sheet of copper foil which, in a finished printed circuit board, constitutes a functional element, said sheet of copper foil having a first surface;
    a substrate sheet of aluminum which constitutes a discardable element; and
    a protective coating layer on a surface of said substrate, the first surface of the copper sheet and the coating layer on said substrate aluminum sheet being engaged with each other, and the engaged surfaces of the sheets being joined together at their edges to define a central zone inwardly of the edges of the sheets, said sheets being unjoined in the central zone, wherein said coating layer is comprised of a material that is selected from the group consisting of a silane, chromium, copper, nickel, silver, gold and alloys of chromium, copper, nickel, silver and gold.

2. A component as defined in claim 1, wherein said coating layer is comprised of a metal that is selected from the group consisting of chromium, copper, nickel, silver, gold and alloys of chromium, copper, nickel, silver and gold, said coating layer having a thickness of at least 20 Å.

3. A component as defined in claim 1, wherein said substrate sheet is joined to said sheet of copper foil by an adhesive.

4. A component as defined in claim 1, wherein said silane is propyltrimethoxysilane.

5. A component as defined in claim 4, wherein said sheet of copper foil is rolled copper foil.

6. A component as defined in claim 4, wherein said sheet of copper foil is electrodeposited copper foil.

7. A component as defined in claim 6, wherein said copper foil is selected from the group consisting of base copper foil, treated copper foil, reverse treated copper foil and double treated copper foil.

8. A component for use in manufacturing printed circuit boards, the component comprised of:
    a sheet of aluminum having a coating layer on at least a first side thereof, said sheet of aluminum constituting a discardable element and said first side having a first surface; and
    a sheet of copper having a first surface, said sheet of copper disposed adjacent said sheet of aluminum with said first surfaces facing each other, an edge of said copper sheet maintained in contact with said coating layer of the sheet of aluminum using an adhesive, wherein said coating layer is comprised of a material that is selected from the group consisting of a silane, chromium, copper, nickel, silver, gold and alloys of chromium, copper, nickel, silver and gold.

9. A component as defined in claim 8, wherein said coating layer is comprised of a metal that is selected from the group consisting of chromium, copper, nickel, silver, gold and alloys of chromium, copper, nickel, silver and gold, said metal having a thickness of at least 20 Å.

10. A component as defined in claim 8, wherein said silane is propyltrimethoxysilane.

11. A component as defined in claim 10, wherein said adhesive is disposed between said coating layer of said sheet of aluminum and said sheet of copper.

12. A component as defined in claim 10, wherein said sheet of copper is rolled copper foil.

13. A component as defined in claim 10, wherein said sheet of copper is electrodeposited copper foil.

14. A component as defined in claim 13, wherein said sheet of copper is selected from the group consisting of base copper foil, treated copper foil, reverse treated copper foil and double treated copper foil.

15. In a component for use in manufacturing printed circuit boards, the component having a first surface of a sheet of copper foil facing a first surface of a sheet of aluminum, said first surfaces of said sheets being in unattached contact with each other in an area that defines a central zone, the improvement comprising:
    a silane coating on said first surface of said sheet of aluminum to prevent staining of said sheet of copper in said central zone, wherein said sheet of copper foil and said sheet of aluminum are joined by a flexible adhesive outside said central zone.

16. A component as defined in claim 15, wherein said silane coating is propyltrimethoxysilane.

17. A component as defined in claim 16, wherein said aluminum sheet and said copper sheet are joined together at their edges to define said central zone inwardly of the edges of said aluminum sheet and said copper sheet.

18. An aluminum separator sheet for use in manufacturing a component for printed circuit boards, said separator sheet having a surface that is coated with a silane, wherein said surface of the aluminum separator sheet coated with the silane is disposed adjacent to a copper sheet, and said silane is propyltrimethoxysilane.

19. A component for use in manufacturing printed circuit boards, comprising:
    two sheets of copper, each sheet of copper having a surface;
    a sheet of aluminum disposed between the two sheets of copper, said sheet of aluminum having first and second surfaces respectively located adjacent to the surface of each of the two sheets of copper,
    a protective coating layer on at least one of the first and second surfaces of the sheet of aluminum, to prevent staining of the sheets of copper in a central zone inward of edges of the sheets of copper, wherein said protective coating layer is comprised of a material that is selected from the group consisting of a silane, chromium, copper, nickel, silver, gold and alloys of chromium, copper, nickel, silver and gold; and
    an adhesive on at least one of the sheets of copper to maintain the sheet of aluminum adjacent to the at least one sheet of copper.

20. A component as defined in claim 19, wherein said silane is propyltrimethoxysilane.

21. A component as defined in claim 19, wherein said adhesive is disposed between said sheet of aluminum and each of said two sheets of copper.

* * * * *